United States Patent
Fiscus et al.

(10) Patent No.: US 7,057,960 B1
(45) Date of Patent: Jun. 6, 2006

(54) METHOD AND ARCHITECTURE FOR REDUCING THE POWER CONSUMPTION FOR MEMORY DEVICES IN REFRESH OPERATIONS

(75) Inventors: Timothy E. Fiscus, South Burlington, VT (US); David E. Chapman, Shelburne, VT (US); Richard M. Parent, Shelburne, VT (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/629,667

(22) Filed: Jul. 29, 2003

Related U.S. Application Data (63) Continuation of application No. 10/090,850, filed on Mar. 4, 2002, now Pat. No. 6,618,314.

(51) Int. Cl.
*G11C 7/00* (2006.01)

(52) U.S. Cl. ...................... 365/222; 365/227

(58) Field of Classification Search ............... 365/222, 365/227, 230.03
See application file for complete search history.

(56) References Cited

U.S. PATENT DOCUMENTS

| | | | |
|---|---|---|---|
| 4,570,242 A | 2/1986 | Nagami | 365/222 |
| 5,251,178 A * | 10/1993 | Childers | 365/227 |
| 5,262,998 A | 11/1993 | Mnich et al. | 365/222 |
| 5,331,601 A | 7/1994 | Parris | 365/230.08 |
| 5,345,574 A | 9/1994 | Sakurada et al. | 395/425 |
| 5,442,588 A | 8/1995 | Runas | 365/222 |
| 5,499,213 A | 3/1996 | Niimi et al. | 365/222 |
| 5,535,169 A * | 7/1996 | Endo et al. | 365/230.03 |
| 5,640,357 A | 6/1997 | Kakimi | 365/229 |
| 5,798,976 A * | 8/1998 | Arimoto | 365/222 |
| 5,831,921 A | 11/1998 | Tsukude | 365/222 |
| 5,875,143 A | 2/1999 | Ben-Zvi | 365/222 |
| 5,894,446 A | 4/1999 | Itou | 365/222 |
| 5,903,507 A | 5/1999 | Arimoto | 365/222 |
| 5,959,924 A | 9/1999 | Son et al. | 365/222 |
| 5,970,507 A | 10/1999 | Kato et al. | 711/106 |
| 5,999,471 A | 12/1999 | Choi | 365/222 |
| 6,067,261 A | 5/2000 | Vogelsang et al. | 365/201 |
| 6,118,719 A | 9/2000 | Dell et al. | 365/222 |
| 6,137,742 A | 10/2000 | Jung | 365/222 |
| 6,141,278 A | 10/2000 | Nagase | 365/222 |
| 6,215,714 B1 | 4/2001 | Takemae et al. | 365/222 |
| 6,246,619 B1 | 6/2001 | Ematrudo et al. | 365/201 |
| 6,256,244 B1 | 7/2001 | Kim | 365/203 |
| 6,275,895 B1 | 8/2001 | Tabo | 711/106 |
| 6,295,243 B1 | 9/2001 | Otsuka et al. | 365/222 |
| 6,381,188 B1 * | 4/2002 | Choi et al. | 365/222 |
| 6,560,153 B1 * | 5/2003 | Mizugaki | 365/222 |
| 6,590,822 B1 * | 7/2003 | Hwang et al. | 365/222 |

* cited by examiner

*Primary Examiner*—Son Mai
(74) *Attorney, Agent, or Firm*—Christopher P. Maiorana, PC (57) ABSTRACT

A method for reducing power consumption during background operations in a memory array with a plurality of sections comprising the steps of (i) controlling the background operations in one or more sections of the memory array in response to one or more control signals and (ii) presenting the one or more control signals and one or more decoded address signals to one or more periphery array circuits of the one or more sections.

27 Claims, 6 Drawing Sheets

FIG. 1
(CONVENTIONAL)

METHOD AND ARCHITECTURE FOR REDUCING THE POWER CONSUMPTION FOR MEMORY DEVICES IN REFRESH OPERATIONS

This is a continuation of U.S. Ser. No. 10/090,850, filed Mar. 4, 2002, now U.S. Pat. No. 6,618,314.

FIELD OF THE INVENTION

The present invention relates to a method and/or architecture for refreshing a memory device generally and, more particularly, to a method and/or architecture for reducing the power consumption for memory devices in refresh operations.

BACKGROUND OF THE INVENTION

Data (i.e., a "1" or a "0") is stored in a 1T memory cell as a voltage level. A "1" can be stored as a high voltage level which can decrease due to leakage. A "0" can be stored as a voltage level of zero volts which can increase due to leakage. Because of leakage, the 1T memory cell uses a periodic refresh to maintain the detected voltage level stored in the cell.

A refresh operation of a memory chip involves a wordline activation that, together with a sensing operation, restores the data stored in the memory cell. When the chip is in an active mode, the current used for refreshing the chip is typically not significant. However, when the chip is in a standby mode, the current used for refreshing can be more important. For example, applications that rely on battery power benefit from low standby current. The growing mobile market has led to a demand for memory devices with a low power standby mode.

Prior dynamic random access memories (DRAMs) refresh all of the memory cells. However, some applications do not need to maintain the data in all of the memory cells during a power down mode or standby mode (i.e., a reduced power mode). Specifically, in battery powered portable terminals (e.g., portable telephones), in many cases, if only some portion of the total memory array has data to be retained in a reduced power mode, all memory cell state information other than that portion need not be retained when in such a mode. Therefore, the current used for refreshing the memory array during the standby mode can be reduced by refreshing only the memory cells containing data to be retained.

However, since conventional dynamic semiconductor memory devices are configured to refresh all the memory cells, reducing the power consumption further (e.g., several hundred microamperes) in the standby mode has been difficult. Because the power consumption in the standby mode can directly affect the continuous standby time, for example, reducing the power consumption in the standby mode can be very important.

Figure 1:
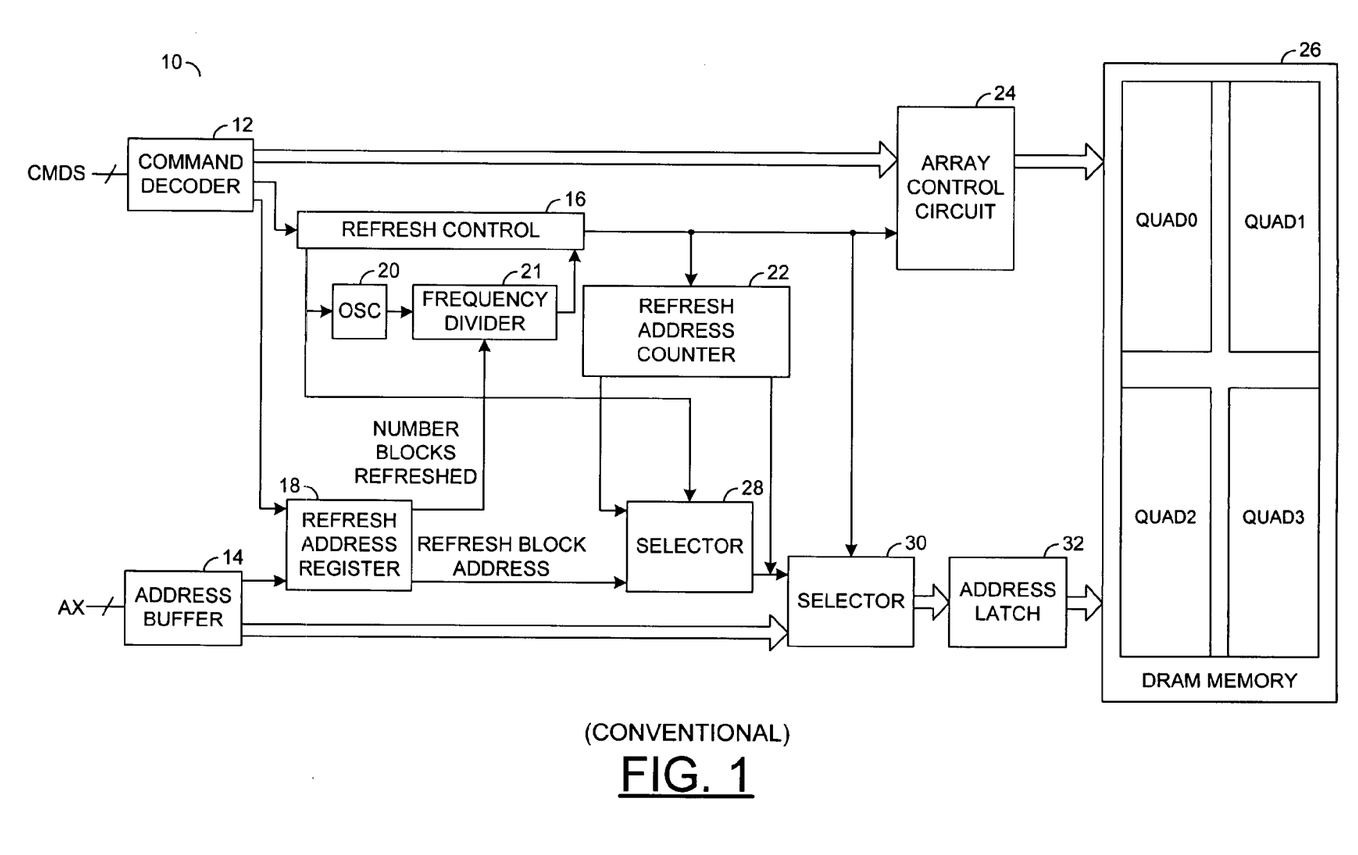
FIG. 1 is a block diagram of a conventional memory device.

Referring to FIG. 1, a conventional memory device 10 is shown. The memory device 10 is similar to one disclosed in U.S. Pat. No. 6,215,714. The memory device 10 has a command decoder 12, an address buffer 14, a refresh control circuit 16, a refresh address register 18, an oscillator 20, a frequency divider 21, a refresh address counter 22, an array control circuit 24, a memory array 26, a selector 28, a selector 30, and an address latch 32. The memory device 10 can refresh all or part of the memory array 26. The device 10 supports partial or full array refresh by programming the refresh address register 18 with the portion of the memory array 26 to be refreshed. The refresh address register 18 controls the higher order bits of the refresh addresses. For example, to refresh half of the memory array 26, the most significant bit is fixed to a "1" or "0" and the rest of the bits generated by the refresh address counter 22 are cycled through for refresh.

When fewer wordlines are refreshed, the refresh rate does not need to be as fast as when the entire array 26 is refreshed. The frequency divider 21 is configured to reduce the refresh rate in response to a signal from the refresh address register to save standby current. The minimum frequency with which a refresh cycle occurs can be determined by dividing the number of wordlines connecting the memory cells to be refreshed by the memory cell retention time.

The memory array 26 is divided into four quadrants. During a normal (e.g., read or write) operation, a wordline is activated in only one quadrant. However, during a refresh operation, one wordline in each of the four quadrants is activated. During such a refresh cycle, the periphery array circuits of all four quadrants are activated and the refresh address counter (RAC) 22 can select the wordline to activate. The RAC 22 can then be incremented for the next refresh cycle.

A disadvantage of the conventional approach is that the periphery array circuits of all four quadrants are activated when less than the full array 26 requires refreshing. Also, additional circuits (e.g., selector 28) are needed for controlling the higher order address bits.

It would be desirable to reduce the power consumption for battery powered portable terminals and various other appliances that use dynamic semiconductor memory devices.

SUMMARY OF THE INVENTION

The present invention concerns a method for reducing power consumption during background operations in a memory array with a plurality of sections comprising the steps of (i) controlling the background operations in one or more sections of the memory array in response to one or more control signals and (ii) presenting the one or more control signals and one or more decoded address signals to one or more periphery array circuits of the one or more sections.

The objects, features and advantages of the present invention include providing a method and/or architecture for reducing the power consumption of memory devices during background operations, such as memory cell refresh operations, that may (i) reduce standby power requirements of a memory device, (ii) refresh one or more sections of a memory array, (iii) activate the support circuits for sections being refreshed, (iv) leave inactive the support circuits for sections not being refreshed and/or (v) perform parity checking and/or housekeeping operations on one or more sections of a memory array.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
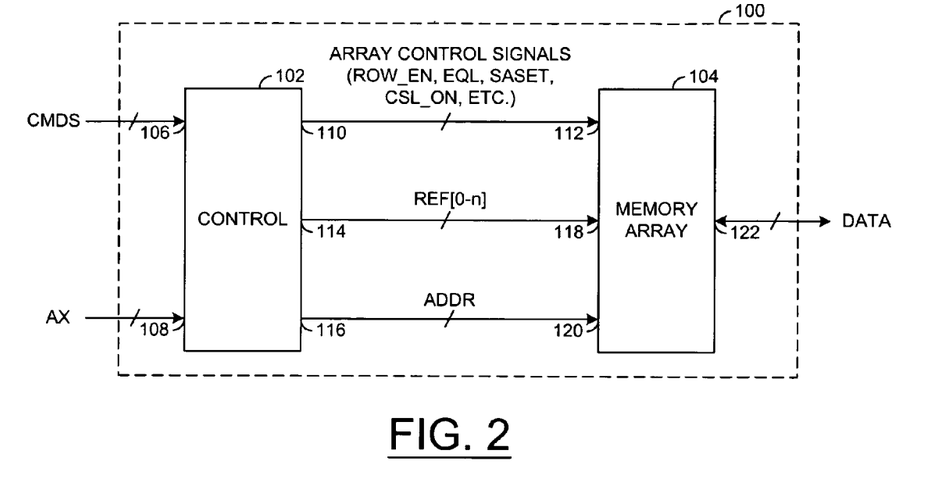
FIG. 2 is a block diagram of a memory device in accordance with a preferred embodiment of the present invention.

Referring to FIG. 2, a block diagram of a circuit 100 is shown in accordance with a preferred embodiment of the present invention. The circuit 100 may be implemented, in one example, as a memory device configured to perform refresh operations on all or a subset (portion) of the memory cells of the memory device. The circuit 100 may comprise a circuit (block) 102 and a circuit (block) 104. The circuit 102 may be implemented as a control circuit. The circuit 104 may be implemented as a memory array. The memory array 104 may be implemented with a plurality of sections. Each of the sections may comprise a number of memory cells and periphery array circuitry configured to access the memory cells. The memory cells are generally arranged in rows and columns. During a refresh operation, the circuit 102 may be configured to (i) enable the periphery array circuitry that corresponds to the sections being refreshed and (ii) disable the periphery array circuitry that corresponds to the sections not being refreshed.

The control circuit 102 may have an input 106 that may receive a number of control signals (e.g., CMDS), an input 108 that may receive a number of address signals (e.g., AX), an output 110 that may present a number of array control signals (e.g., ROW_EN, EQL, SASET, CSL_ON, etc.) to an input 112 of the memory array 104, an output 114 that may present a number of control signals (e.g., REF0–REFn), and an output 116 that may present a number of address signals (e.g., ADDR). The signals CMDS may comprise, in one example, a chip select signal (e.g., /CS), a row address strobe signal (e.g., /RAS), a column address strobe signal (e.g., /CAS), a write enable signal (e.g., /WE), and a clock signal (e.g., CLK). However, other signals may be implemented accordingly to meet the design criteria of a particular application. The signals REF0–REFn may be implemented as refresh control signals. The signals REF0–REFn may control (enable/disable) the periphery array circuits of the sections of the memory array 104. The signals ADDR may be implemented to select memory locations for read, write, and/or refresh operations. The circuit 102 may be configured to generate the signals ROW_EN, EQL, SASET, CSL_ON, REF0–REFn and ADDR in response to the signals CMDS and AX.

The memory array 104 may have an input 118 that may receive the signals REF0–REFn, an input 120 that may receive the signals ADDR and an input/output 122 that may receive/present a signal (e.g., DATA). The memory array 104 may be configured, in one example, to decode the signals ADDR to generate row and/or column addresses. The memory array 104 may be configured to read and write information via the signal DATA and to perform refresh operations in response to one or more of the signals ROW_EN, EQL, SASET, CSL_ON, REF0–REFn, and ADDR.

Figure 3:
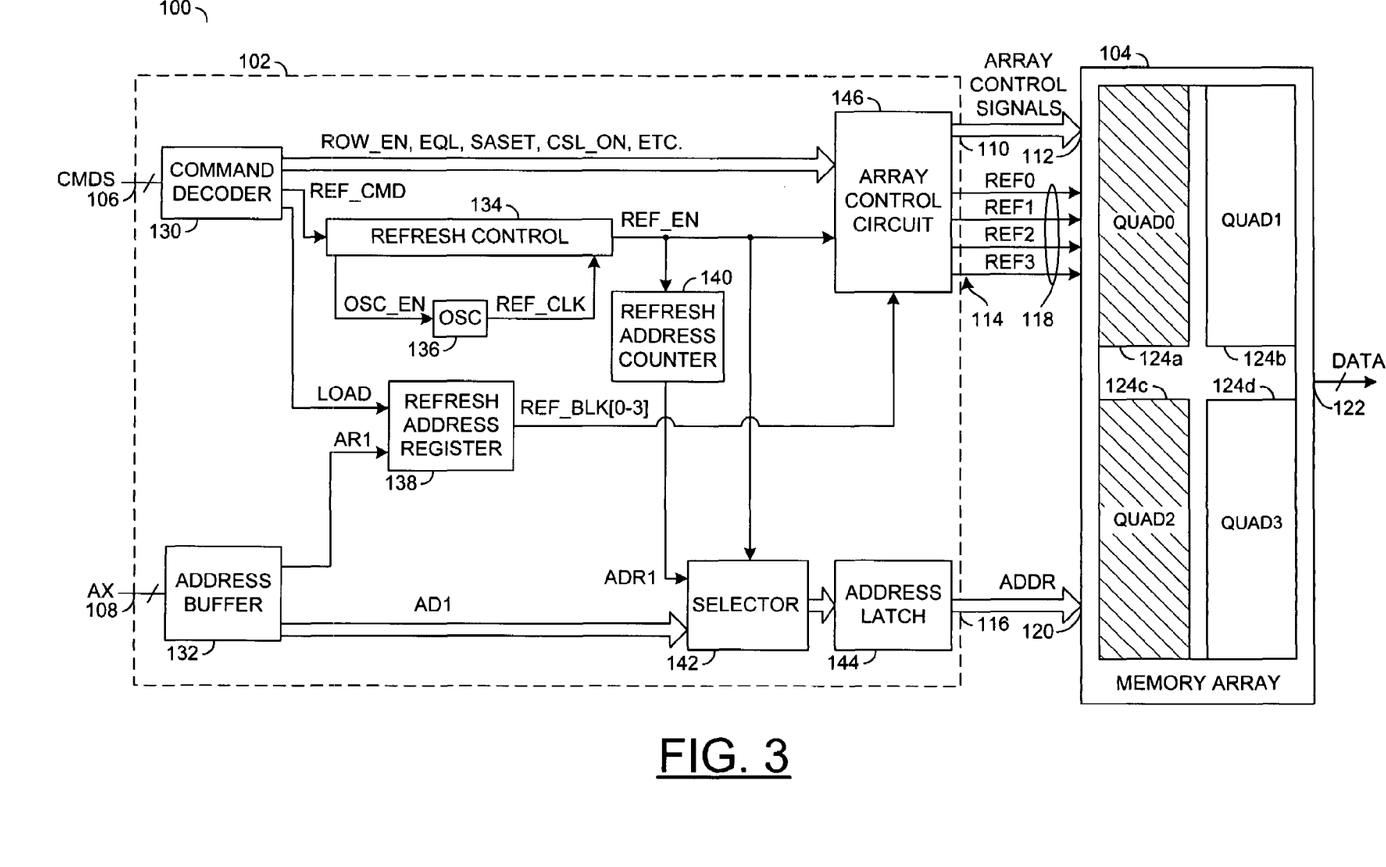
FIG. 3 is a more detailed block diagram of a memory device in accordance with a preferred embodiment of the present invention.

Referring to FIG. 3, a more detailed block diagram of a preferred embodiment of the present invention is shown. In one example, the memory array 104 may be implemented with four sections (quadrants) 124a–124d. However, other numbers of sections may be implemented accordingly to meet the design criteria of a particular application. Each of the sections 124 generally comprises periphery array circuitry (described in more detail in connection with FIG. 5) that is generally controlled in response to one or more of the signals REF0–REFn. In the example where the memory array 104 comprises four sections 124 (e.g., QUAD0–QUAD3), four control signals REF0–REF3 are generally implemented.

The circuit 102 may comprise a command decoder circuit (block) 130, an address buffer 132, a refresh control circuit (block) 134, an oscillator circuit (block) 136, a register 138, a counter 140, a selector circuit (block) 142, a latch 144, and a control circuit (block) 146. The command decoder circuit 130 may be configured to generate a refresh command signal (e.g., REF_CMD) and a number of control signals (e.g., LOAD, ROW_EN, EQL, SASET, CSL_ON) in response to the signals CMDS. The signal ROW_EN may be implemented as a row enable signal. The signal EQL may be implemented as an equalization control signal. The signal SASET may be implemented as a sense amplifier control signal. The signal CSL_ON may be implemented as a column multiplexer control signal.

The address buffer 132 may have (i) an input that may receive the signals AX, (ii) a first output that may present a signal (e.g., AR1) to a first input of the register 138 and (iii) a second output that may present a signal (e.g., AD1) to a first input of the selector circuit 142. The signal AR1 may be implemented as a refresh block address. The signal AD1 may be implemented to control read and write accesses of the memory array 104.

The signal REF_CMD may be presented to a first input of the refresh control circuit 134. The refresh control circuit 134 may have (i) a first output that may present a control signal (e.g., OSC_EN) to the oscillator 136, (ii) a second input that may receive a signal (e.g., REF_CLK) from the oscillator 136 and (iii) a second output that may present a refresh control signal (e.g., REF_EN). The refresh control circuit 134 may be configured to generate the signal REF_EN in response to the signals REF_CMD and REF_CLK. In one example, the signal REF_CMD may be implemented as a self-refresh command signal and the signal REF_CLK may be implemented as a self-refresh clock signal.

The oscillator circuit 136 may be configured to generate the signal REF_CLK with a predetermined frequency in response to the control signal OSC_EN. The frequency of the signal REF_CLK may be selected (determined) to ensure an appropriate refreshing rate of the portion of the memory array 104 to be refreshed.

The register 138 may be implemented as a refresh address register. The signal LOAD may be presented to a second input of the register 138. The register 138 may be configured to register (latch) the signal AR1 in response to the signal LOAD. The register 138 may have an output that may present a signal (e.g., REF_BLK). The signal REF_BLK may be implemented, in one example, as one or more control signals. Alternatively, the signal REF_BLK may be implemented as a multi-bit signal. When the signal REF_BLK is implemented as a multi-bit signal, each of the bits may be used as a separate control signal. The register 138 may be configured to generate the signal REF_BLK in response to a number of sections of the memory array 104 to be refreshed. In one example, the signal REF_BLK may be implemented as a refresh block address. Alternatively, the signal REF_BLK may be implemented as a number of control signals (e.g., REF_BLK0–REF_BLKn) where each control signal corresponds to a section of the memory array 104. For example, when the memory array 104 is divided into four sections (quadrants), four control signals REF_BLK0–REF_BLK3 may be implemented. In one example, the control signals REF_BLK0–REF_BLKn may be implemented as decoded block address signals.

The refresh address counter 140 may be configured to generate a refresh address (e.g., the signal ADR1) for refreshing one or more memory cells of the memory array 104. In one example, the refresh address counter 140 may be configured to increment or decrement the refresh address ADR1 by one each time the refresh control signal REF_EN is asserted. For example, the refresh address counter 140 may be implemented as a binary counter. However, other types of counters may be implemented accordingly to meet the design criteria of a particular application. For example, the counter 140 may be implemented as a Gray code counter. A Gray code counter may be configured to generate a sequence of numbers according to the Gray code (e.g., a code where only one bit in a binary numerical representation changes between successive numbers). Generating the sequence of addresses according to the Gray code generally has an advantage that only a single bit of the signal ADR1 changes between successive refresh cycles. Implementing the counter 140 as a Gray code counter may further reduce current consumption in the standby mode since only a single bit changes state between successive addresses. In general, the refresh address counter 140 is generally configured to generate the refresh address ADR1 in response to each assertion of the refresh control signal REF_EN.

The refresh control signal REF_EN may be presented to a control input of the selector circuit 142. When the refresh control signal REF_EN is asserted (e.g., ON, or a logic "1"), the selector circuit 142 generally selects the refresh address ADR1 from the refresh address counter 140. When the refresh control signal REF_EN is de-asserted (e.g., OFF, or a logic "0"), the selector circuit 142 generally selects the address AD1 from the address buffer 132. The address selected by the circuit 142 is generally passed to the latch 144. The latch 144 generally presents the selected address (e.g., AD1 or ADR1) to the memory array 104 as the signal ADDR. The register 138 and the latch 144 may be implemented as registers, latches, and/or flip-flops.

The refresh control signal REF_EN, the signal REF_BLK and the signals ROW_EN, EQL, SASET, and CSL_ON are generally presented to respective inputs of the circuit 146. The circuit 146 may be configured to control, in one example, a refresh operation on all or a portion of the memory cells of the memory array 104 that are addressed by the signal ADDR. However, other operations (e.g., background memory accesses) may be controlled accordingly to meet the design criteria of a particular application. To retain the contents of the memory cells in the memory array 104, the refresh operation may be repeated a predetermined number of times (e.g., determined by the number of wordlines to be activated) within a predetermined period of time (e.g., determined by the memory cell retention time for the array 104).

In one example, the circuit 146 may be configured to generate the control signals REF0–REF3. The control signals REF0–REFn generally enable the refreshing of individual sections of the memory array 104. In one example, when the memory array 104 is divided into four sections (e.g., the quadrants QUAD0–QUAD3), a refresh operation on one or more memory cells in each of the sections 124 may be controlled (enabled/disabled) by the corresponding refresh control signal REF0–REF3. The circuit 146 may be configured to generate the signals REF0–REFn in response to the signals REF_EN and REF_BLK.

Each of the signals REF0–REFn may be implemented to enable, in one example, the periphery array circuitry (described in connection with FIGS. 4 and 5) of respective sections of the memory array 104. Each of the signals REF0–REFn is generally asserted (e.g., "ON", or a logic "1") when the corresponding section 124 of the memory array 104 is to be refreshed and de-asserted (e.g., "OFF", or a logic "0") when the corresponding section 124 is not to be refreshed. By activating the periphery array circuits of the sections 124 to be refreshed while leaving the periphery array circuits of sections 124 not to be refreshed inactive, the amount of power consumed by the circuit 100 during a refresh operation is generally reduced. During read and write accesses, all of the periphery array circuits are generally enabled.

Figure 4:
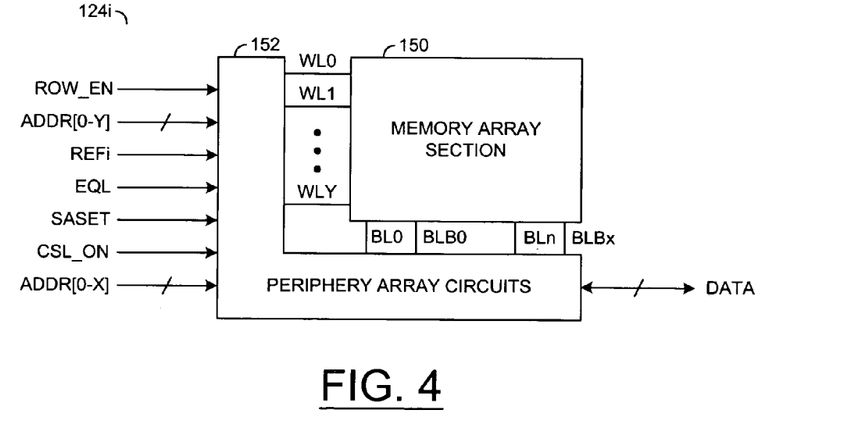
FIG. 4 is a block diagram of a memory array section of FIG. 3.

Referring to FIG. 4, a block diagram of a section 124i of the memory array 104 is shown. Each section 124 of the memory array 104 may comprise a memory array section 150 and a periphery array circuit (block) 152. The signals ROW_EN, REFi, SASET, CSL_ON, ADDR, EQL, and DATA may be presented to respective inputs of the periphery array circuit 152. The periphery array circuit 152 may be coupled to the memory array section 150 via a number of wordlines (e.g., WL0–WLy), a number of bitlines (e.g., BL0–BLX) and a number of complementary bitlines or bitline bars (e.g., BLB0–BLBx). In one example, the signal ADDR may be presented as decoded row and column addresses (e.g., ADDR[0–y] and ADDR[0–x] respectively). The periphery array circuit(s) 152 may be enabled in response to a first state of the signal REFi and disabled in response to a second state of the signal REFi.

Figure 5:
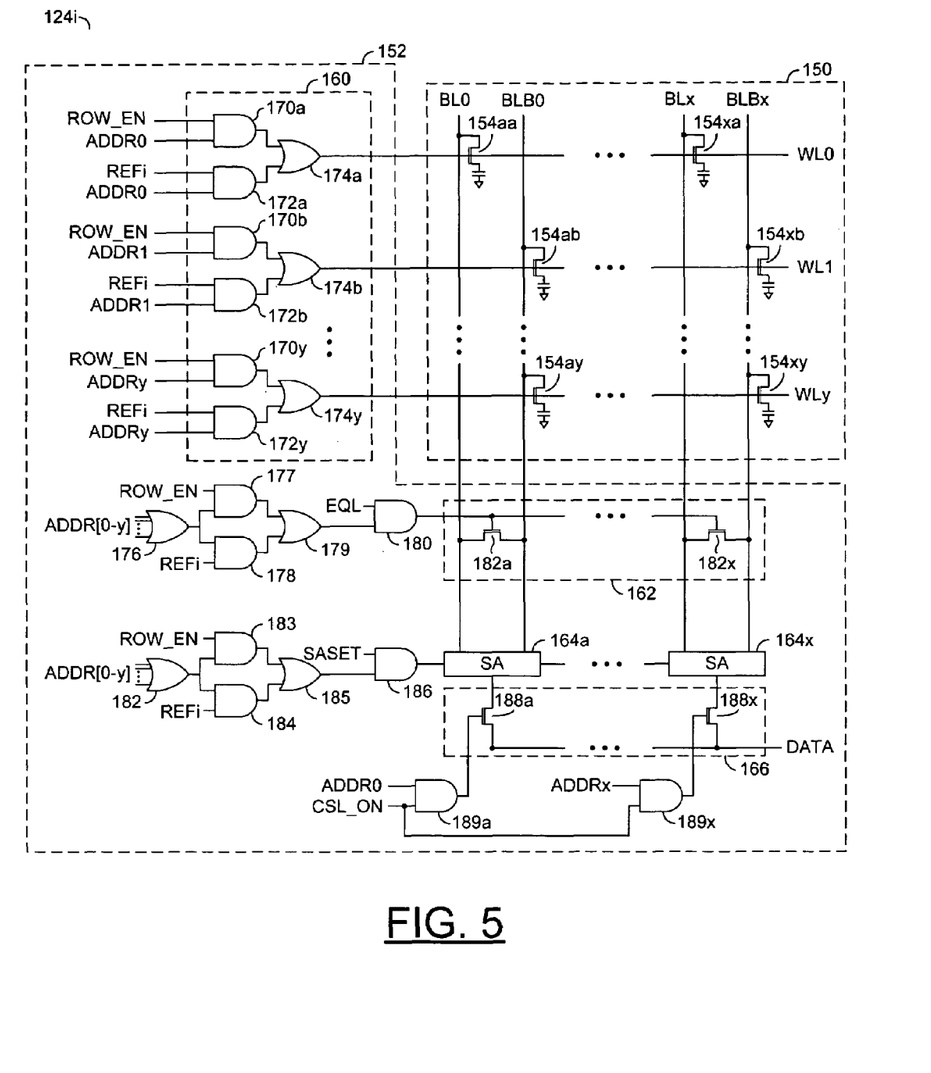
FIG. 5 is a more detailed block diagram of a memory array section of FIG. 4.

Referring to FIG. 5, a more detailed block diagram of the memory array section 124i of FIG. 4 is shown. The memory array section 150 may comprise a number of storage elements 154aa–154xy arranged in y number of rows and x number of columns. The storage elements 154aa–154xy may be implemented, in one example, as dynamic storage (memory) elements. For example, the storage elements 154aa–154xy may be implemented as 1T dynamic random access memory (DRAM) cells. Each of the storage elements 154aa–154xy may be configured to present/receive data via a respective bitline BL0–BLx and/or complementary bitline BLB0–BLBx in response to a respective wordline WL0–WLy being activated (asserted). The periphery array circuit 152 may comprise a wordline driver circuit 160, an equalization circuit 162, a number of sense amplifiers 164a–164x and a column select multiplexer circuit 166. The circuit 160 is generally configured to generate the signals WL0–WLy in response to a logical combination of the signals ROW_EN, ADDR[0–y] and REFi. For example, the circuit 160 may comprise a number of AND gates 170a–170y and 172a–172y and a number of OR gates 174a–174y. The signal ROW_EN and ADDR0 may be presented to inputs of the AND gate 170a. The signals REFi and ADDR0 may be presented to inputs of the AND gate 172a. Outputs of the AND gate 170a and the AND gate 172a may be presented to inputs of the OR gate 174a. The wordline signal WL0 may be presented at an output of the OR gate 174a. The gates 170b–170y, 172b–172y and 174b–174y may be configured similarly to generate the wordline signals WL1–WLy in response to the signals ROW_EN, REFi and ADDR[1–y], respectively.

The signals EQL, ROW_EN, ADDR[0–y] and REFi may be logically combined (e.g., by an OR gate 176, an AND gate 177, an AND gate 178, an OR gate 179 and an AND gate 180) to control the equalization circuit 162. The equalization circuit 162 may comprise a number of equalization transistors 182a–182x. The transistors 182a–182x may be configured to equalize a voltage level of a bitline pair (e.g., BL0 and BLB0, BL1 and BLB1, etc.). For example, the transistors 182a–182x may be configured to couple a respective pair of bitlines (e.g., BL0 and BLB0, BL1 and BLB1, etc.) to one another and/or a predetermined equalization potential.

Each of the bitline pairs (BL0 and BLB0, BL1 and BLB1, . . . , BLx and BLBx) may be coupled to a respective sense amplifier 164a–164x. In one example, the sense amplifiers 164a–164x may be controlled in response to a logical combination of the signals SASET, ROW_EN, ADDR[0–y] and REFi (e.g., by an OR gate 182, an AND gate 183, an AND gate 184, an OR gate 185 and an AND gate 186). Alternatively, a single control signal may be implemented to gate the signals EQL and SASET (e.g., the output of the gate 179).

The signal DATA may be coupled to the sense amplifiers 164a–164x via the column multiplexing circuit 166. The column multiplexing circuit 166 may comprise a number of transistors 188a–188x. The transistors 188a–188x may be controlled in response to the signals CSL_ON and ADDR[0–x]. For example, the signals CSL_ON and ADDR[0–x] may be logically combined (e.g., by a number of AND gates 189a–189x) to control a respective transistor 188a–188x. The particular gates and logical combinations have been shown for illustration purposes. Other types of gates and/or logical combinations may be implemented accordingly to meet the design criteria of a particular application.

Figure 6:
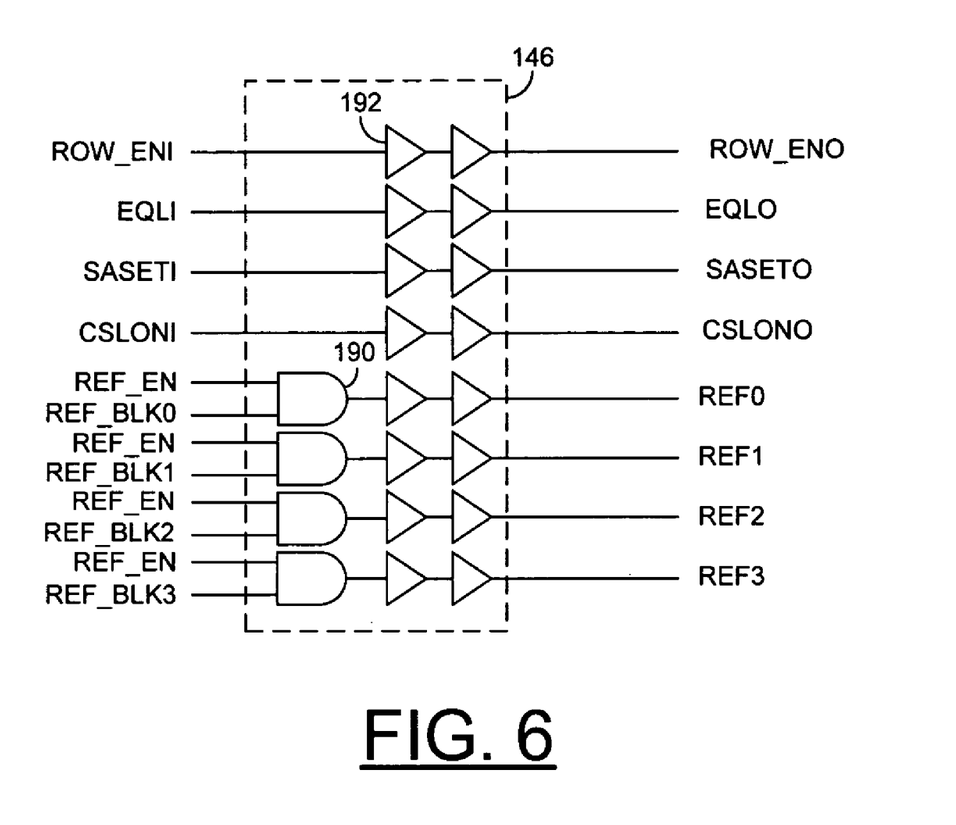
FIG. 6 is a more detailed block diagram of an array control circuit of FIG. 3.

Referring to FIG. 6, a more detailed block diagram of the array control circuit 146 of FIG. 3 is shown. The circuit 146 may comprise a plurality of gates 190 and a plurality of gates 192. In one example, the gates 190 may be implemented as two-input AND gates. The gates 192 may be implemented, in one example, as non-inverting buffers (drivers). However, other types of gates may be implemented accordingly to meet the design criteria of a particular application.

The signals ROW_EN, EQL, SASET, and CSL_ON are generally buffered by the gates 192 and presented to the memory array 104. The signal REF_EN may be logically combined with the signals REF_BLK0–REF_BLK3 to generate the signals REF0–REF3, respectively. The signals REF0–REF3 are generally buffered similarly to the signals ROW_EN, EQL, SASET, and CSL_ON and presented to the memory array 104.

Figure 7:
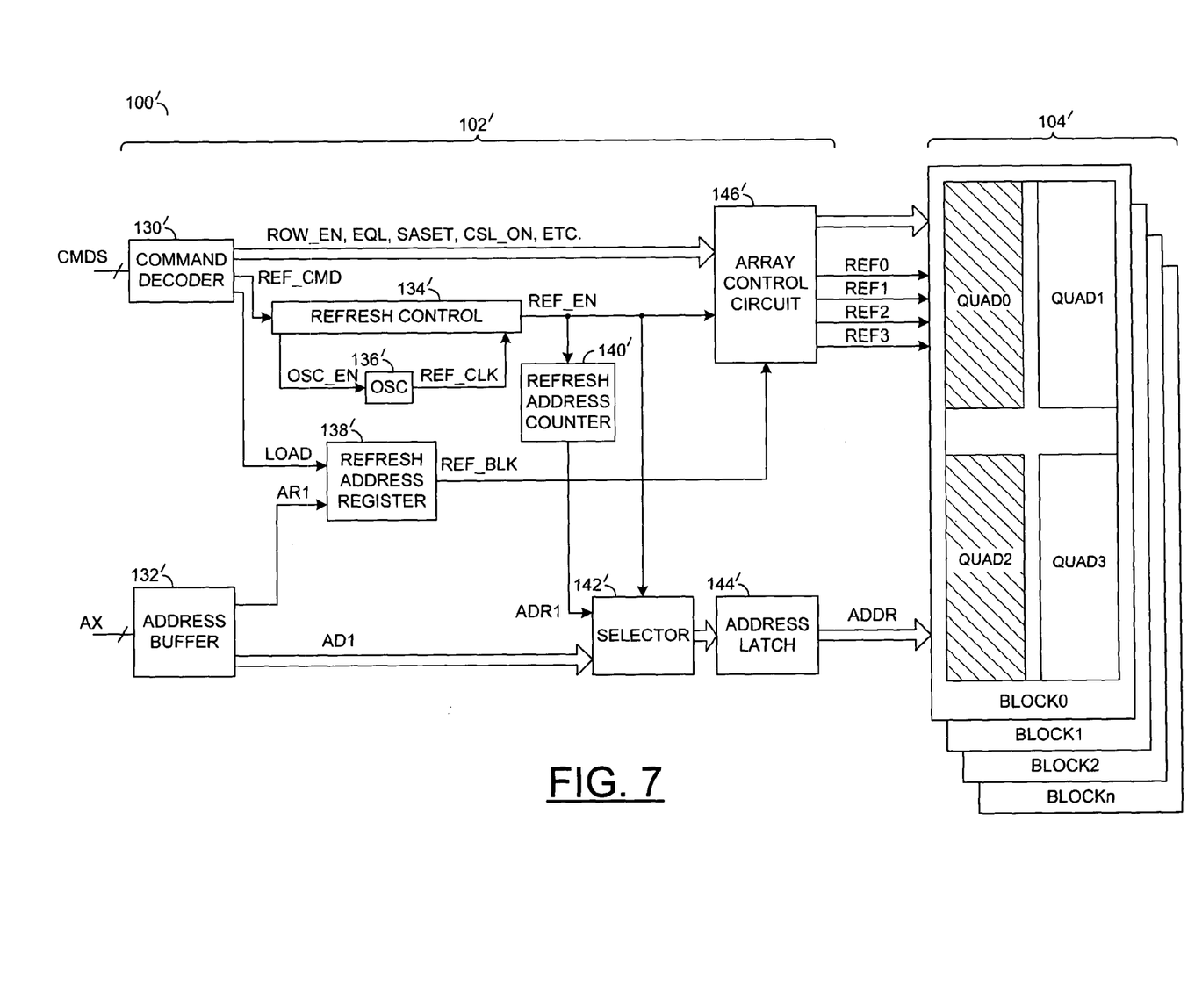
FIG. 7 is a block diagram of an alternative embodiment of the present invention.

Referring to FIG. 7, a block diagram of a circuit 100' illustrating an alternative embodiment of the present invention is shown. The circuit 100' may be implemented similarly to the circuit 100 except that the memory array 104' may be implemented with a number of blocks (e.g., BLOCK (1–n)). Each block of the memory array 104' may comprise a number of sections 124'. The sections 124' may be implemented similarly to the sections 124 (described in connection with FIGS. 3–5 above). The circuit 102' may be configured to control (e.g., enable/disable) the periphery array circuitry of one or more of the sections 124' in one or more of the blocks of the memory array 104'.

The present invention generally provides a method and/or an architecture for reducing the standby current of a memory device by reducing the periphery array circuitry activated during a partial array refresh. The present invention may provide, in one example, a capability to refresh one-fourth, one-half, three-quarters, and/or all of the memory array space of, in one example, a dynamic random access memory (DRAM). The portion of the array to be refreshed may be controlled by information (e.g., a block address) stored in a refresh address register.

The present invention may be configured to control the periphery array circuitry of a number of memory array sections during a refresh operation of a memory device or apparatus. The refresh address counter (RAC) is generally configured to cycle through the address space of the memory array. The refresh address register generally controls the number of sections of the memory array that are activated during the refresh operation. For example, to refresh one-half of the memory array of a device with four sections, the refresh block register may be configured to assert the signals REF0 and REF1 to activate the periphery array circuits of the sections 0 and 1 of the memory array. However, other patterns of activated sections may be implemented accordingly to meet the design criteria of a particular application. By not activating the periphery array circuits of sections 2 and 3, the standby current of the device is generally reduced.

The present invention may be implemented to control other background memory access operations and/or housekeeping operations. For example, the present invention may be configured, in one example, to control a parity checking operation of a memory array.

The various signals of the present invention are generally "ON" (e.g., a digital HIGH, or 1) or "OFF" (e.g., a digital LOW, or 0). However, the particular polarities of the ON (e.g., asserted) and OFF (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

What is claimed is:

1. A method for reducing power consumption during background operations in a memory array with a plurality of sections comprising the steps of:

controlling said background operations in each of said plurality of sections of said memory array in response to one or more control signals, wherein said one or more control signals are generated in response to a programmable address signal and said background operations can be enabled simultaneously in two or more of said plurality of sections independently of any other section; and presenting said one or more control signals and one or more decoded address signals to one or more periphery array circuits of said plurality of sections.

2. The method according to claim 1, wherein said background operations comprise a refresh operation.

3. The method according to claim 1, wherein said plurality of sections comprise quadrants.

4. The method according to claim 1, wherein said background operations comprise parity checking.

5. The method according to claim 1, further comprising:

controlling, in response to said one or more control signals, an operation of said one or more periphery array circuits, wherein said periphery array circuits each comprise one or more circuits from the group consisting of sense amplifiers, column multiplexer circuits, equalization circuits, and wordline driver circuits.

6. The method according to claim 1, further comprising: generating one of said one or more control signals for each of said plurality of sections of said memory array.

7. The method according to claim 1, further comprising: generating said one or more control signals in response to a refresh enable signal.

8. The method according to claim 7, further comprising generating a memory cell selection signal comprising a binary numerical representation configured such that a single bit changes between successive numbers in response to said refresh enable signal.

9. An apparatus comprising:
means for controlling a background operation in each of a plurality of sections of a memory array in response to one or more control signals, wherein said one or more control signals are generated in response to a programmable address signal and said background operations can be enabled simultaneously in two or more of said plurality of sections independently of any other section; and
means for presenting said one or more control signals and one or more decoded address signals to one or more periphery array circuits of said plurality of sections.

10. An apparatus comprising:
a memory array comprising a plurality of sections, wherein each of said sections comprises (i) a plurality of memory cells and (ii) periphery array circuitry configured to control access to said plurality of memory cells; and
a control circuit configured to present one or more control signals and one or more decoded address signals to said periphery array circuitry of said plurality of sections, wherein said one or more control signals are generated in response to a programmable address signal, a background operation in each of said plurality of sections is controlled in response to said one or more control signals and said background operation can be enabled simultaneously in two or more of said plurality of sections independently of any other section.

11. The apparatus according to claim 10, wherein said background operation comprises a refresh operation.

12. The apparatus according to claim 10, wherein each of said one or more control signals is configured to control one or more array control signals of a corresponding section.

13. The apparatus according to claim 10, wherein said periphery array circuitry comprises one or more sense amplifiers configured to sense a memory cell state in response to said one or more control signals and said one or more decoded address signals.

14. The apparatus according to claim 10, wherein said periphery array circuitry is configured to generate one or more wordline signals in response to said one or more control signals and said one or more decoded address signals.

15. The apparatus according to claim 10, wherein said periphery array circuitry comprises equalization circuitry configured to equalize one or more bitlines to a predetermined voltage potential in response to said one or more control signals and said one or more decoded address signals.

16. The apparatus according to claim 10, wherein said periphery array circuitry comprises column multiplexing circuitry.

17. The apparatus according to claim 10, wherein each of said memory cells comprises a dynamic storage element.

18. The apparatus according to claim 10, wherein said background operation comprises parity checking.

19. The apparatus according to claim 10, wherein said one or more decoded address signals comprise one or more decoded row address signals and one or more decoded column address signals.

20. The apparatus according to claim 10, wherein said periphery array circuitry of each of said plurality of sections is configured to control said plurality of memory cells of each of said plurality of sections in response to (i) said one or more control signals and (ii) said one or more decoded address signals.

21. The apparatus according to claim 10, wherein said memory array comprises a plurality of blocks and each block of said plurality of blocks comprises two or more of said plurality of sections.

22. The method according to claim 1, wherein said one or more decoded address signals comprise one or more decoded row address signals and one or more decoded column address signals.

23. The method according to claim 1, wherein said background operations are enabled in response to a first state of said one or more control signals.

24. The method according to claim 1, wherein said background operations are disabled in response to a first state of said one or more control signals.

25. A method for reducing power consumption during parity checking in a memory array with a plurality of sections comprising the steps of:
controlling said parity checking in one or more of said plurality of sections of said memory array in response to one or more control signals; and
presenting said one or more control signals and one or more decoded address signals to one or more periphery array circuits of said one or more sections.

26. A method for reducing power consumption during background operations in a memory array with a plurality of sections comprising the steps of:
controlling said background operations in one or more of said plurality of sections of said memory array in response to one or more control signals;
presenting said one or more control signals and one or more decoded address signals to one or more periphery array circuits of said one or more sections; and
generating a memory cell selection signal comprising a binary numerical representation configured such that a single bit changes between successive numbers in response to a refresh enable signal.

27. An apparatus comprising:
a memory array comprising a plurality of sections, wherein each of said sections comprises (i) a plurality of memory cells and (ii) periphery array circuitry configured to control access to said plurality of memory cells; and
a control circuit configured to present one or more control signals and one or more decoded address signals to said periphery array circuitry of said plurality of sections, wherein (a) a background operation in each of said plurality of sections (i) is controlled in response to said one or more control signals and (ii) can be enabled independently of any other section and (b) said control circuit comprises (i) an array control circuit configured to generate said one or more control signals in response to one or more block address signals and a refresh enable signal and (ii) a register configured to store said one or more block address signals.

* * * * *